(12) United States Patent
Kim

(10) Patent No.: US 8,913,414 B2
(45) Date of Patent: Dec. 16, 2014

(54) SEMICONDUCTOR APPARATUS AND SEMICONDUCTOR SYSTEM FOR OUTPUTTING INTERNAL INFORMATION ACCORDING TO VARIOUS MODE AND METHOD FOR OUTPUTTING INTERNAL INFORMATION THEREOF

(75) Inventor: Ju Young Kim, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 485 days.

(21) Appl. No.: 13/171,815

(22) Filed: Jun. 29, 2011

(65) Prior Publication Data

US 2012/0133423 A1 May 31, 2012

(30) Foreign Application Priority Data

Nov. 29, 2010 (KR) .................. 10-2010-0119817

(51) Int. Cl.
*G11C 5/06* (2006.01)
*G11C 7/04* (2006.01)
*G11C 11/406* (2006.01)
*G11C 29/32* (2006.01)

(52) U.S. Cl.
CPC .... *G11C 11/40626* (2013.01); *G11C 11/40618* (2013.01); *G11C 29/32* (2013.01); *G11C 2029/3202* (2013.01)
USPC .......................................... 365/63; 365/211

(58) Field of Classification Search
CPC .. G11C 11/401; G11C 11/402; G11C 11/406; G11C 11/40626; G11C 11/40622; G11C 11/40618; G11C 11/40615; G11C 11/40611; G11C 11/40603; G11C 11/40607; G11C 2211/406

USPC ................................. 365/222, 211; 711/106
See application file for complete search history.

(56) References Cited

U.S. PATENT DOCUMENTS

2009/0168840 A1* 7/2009 Song et al. .................. 374/170
2011/0205826 A1* 8/2011 Kuroda ....................... 365/222

FOREIGN PATENT DOCUMENTS

KR 10-2009-0074548 A 7/2009

* cited by examiner

*Primary Examiner* — Vanthu Nguyen
*Assistant Examiner* — Khamdan Alrobaie
(74) *Attorney, Agent, or Firm* — William Park & Associates Patent Ltd.

(57) ABSTRACT

A semiconductor apparatus may include a plurality of through-semiconductor chip lines which pass through a plurality of stacked semiconductor chips. An uppermost semiconductor chip among the plurality of stacked semiconductor chips is configured to transfer its internal information signal to an assigned corresponding through-semiconductor chip line, and at least one semiconductor chip other than the uppermost semiconductor chip is configured to logically combine respective internal information signals transferred through through-semiconductor chip lines and their internal information signals and sequentially transfer resultant signals to assigned corresponding through-semiconductor chip lines. The at least one semiconductor chip other than the uppermost semiconductor chip logically combines the internal information signals transferred through the through-semiconductor chip lines from adjoining semiconductor chips and its internal information signals.

19 Claims, 2 Drawing Sheets

SEMICONDUCTOR APPARATUS AND SEMICONDUCTOR SYSTEM FOR OUTPUTTING INTERNAL INFORMATION ACCORDING TO VARIOUS MODE AND METHOD FOR OUTPUTTING INTERNAL INFORMATION THEREOF

CROSS-REFERENCES TO RELATED APPLICATION

The present application claims priority under 35 U.S.C. §119(a) to Korean Patent Application No. 10-2010-0119817, filed on, Nov. 29, 2010, in the Korean Intellectual Property Office, which is incorporated herein by reference in its entirety as if set forth in full.

BACKGROUND

1. Technical Field

Various embodiments of the present invention relates to a semiconductor system having a semiconductor apparatus comprising a plurality of stacked semiconductor chips and a controller. In particular, certain embodiments relate to a technology for outputting internal information signals of respective semiconductor chips.

2. Related Art

A semiconductor memory apparatus may deliver internal temperature information to an external memory controller. The memory controller typically controls the refresh cycle of the semiconductor memory apparatus based on the received temperature information.

Meanwhile, a semiconductor apparatus comprising a plurality of stacked semiconductor chips includes through-semiconductor chip lines for commonly transferring signals among the plurality of stacked semiconductor chips. In this regard, if the semiconductor chips deliver their temperature information through a single through-semiconductor chip line, collisions may occur among the pieces of information from the plurality of the semiconductor chips when the semiconductor chips deliver different pieces of temperature information. This may result in delivery of imprecise information to the memory controller. Accordingly, a technology for reliable delivery of temperature information through multiple through-semiconductor chip lines is needed in the art.

SUMMARY

Accordingly, there is a need for an improved memory system that allows reliable delivery of temperature information through multiple through-semiconductor chip lines in the memory system.

To attain the advantages and in accordance with the purposes of the invention, as embodied and broadly described herein, one exemplary aspect of the present invention may provide a semiconductor apparatus including a plurality of through-semiconductor chip lines which pass through a plurality of stacked semiconductor chips. In a normal mode, an uppermost semiconductor chip among the plurality of stacked semiconductor chips may be configured to transfer its internal information signal to an adjoining semiconductor chip through an assigned corresponding through-semiconductor chip line, and at least one semiconductor chip other than the uppermost semiconductor chip is configured to logically combine respective internal information signals transferred through through-semiconductor chip lines and its internal information signals and sequentially transfer resultant signals to assigned corresponding through-semiconductor chip lines, the at least one semiconductor chip other than the uppermost semiconductor chip logically combining the internal information signals transferred through the through-semiconductor chip lines from adjoining semiconductor chips and its internal information signals. Furthermore, in a scan mode, a corresponding internal information signal outputted from a semiconductor chip selected among the plurality of semiconductor chips may be sequentially transferred through the plurality of through-semiconductor chip lines.

In another exemplary aspect of the present invention, a semiconductor apparatus may include a plurality of through-semiconductor chip lines which pass through a plurality of stacked semiconductor chips. An uppermost semiconductor chip among the plurality of stacked semiconductor chips may be configured to transfer its internal information signal to an assigned corresponding through-semiconductor chip line, and remaining semiconductor chips may be configured to logically combine respective internal information signals transferred through through-semiconductor chip lines and their internal information signals and sequentially transfer resultant signals to assigned corresponding through-semiconductor chip lines, the respective remaining semiconductor chips logically combining the internal information signals transferred through the through-semiconductor chip lines from adjoining semiconductor chips and their internal information signals.

In another exemplary aspect of the present invention, a semiconductor system may include: a controller configured to provide external chip selection code signals; and a semiconductor apparatus having a plurality of through-semiconductor chip lines which respectively pass through a plurality of stacked semiconductor chips, wherein each of the plurality of semiconductor chips is configured to receive the external chip selection code signals and generate chip selection code signals assigned to it. In a normal mode, an uppermost semiconductor chip among the plurality of stacked semiconductor chips is configured to transfer its internal information signal to an adjoining semiconductor chip through an assigned corresponding through-semiconductor chip line, and remaining semiconductor chips are configured to logically combine respective internal information signals transferred through through-semiconductor chip lines and their internal information signals and sequentially transfer resultant signals to assigned corresponding through-semiconductor chip lines, the respective remaining semiconductor chips logically combining the internal information signals transferred through the through-semiconductor chip lines from adjoining semiconductor chips and their internal information signals. Furthermore, in a scan mode, a corresponding internal information signal outputted from a semiconductor chip selected among the plurality of semiconductor chips may be sequentially transferred through the plurality of through-semiconductor chip lines.

In another exemplary aspect of the present invention, a method for outputting internal information of a plurality of stacked semiconductor chips may include: applying external chip selection code signals to the plurality of stacked semiconductor chips and generating chip selection code signals assigned to the respective semiconductor chips; and sequentially transferring internal information signals assigned to the respective semiconductor chips through a plurality of through-semiconductor chip lines in response to the chip selection code signals, wherein each of the plurality of semiconductor chips logically combines an internal information signal transferred through a through-semiconductor chip line from an adjoining semiconductor chip and its internal information signal and outputs a resultant signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
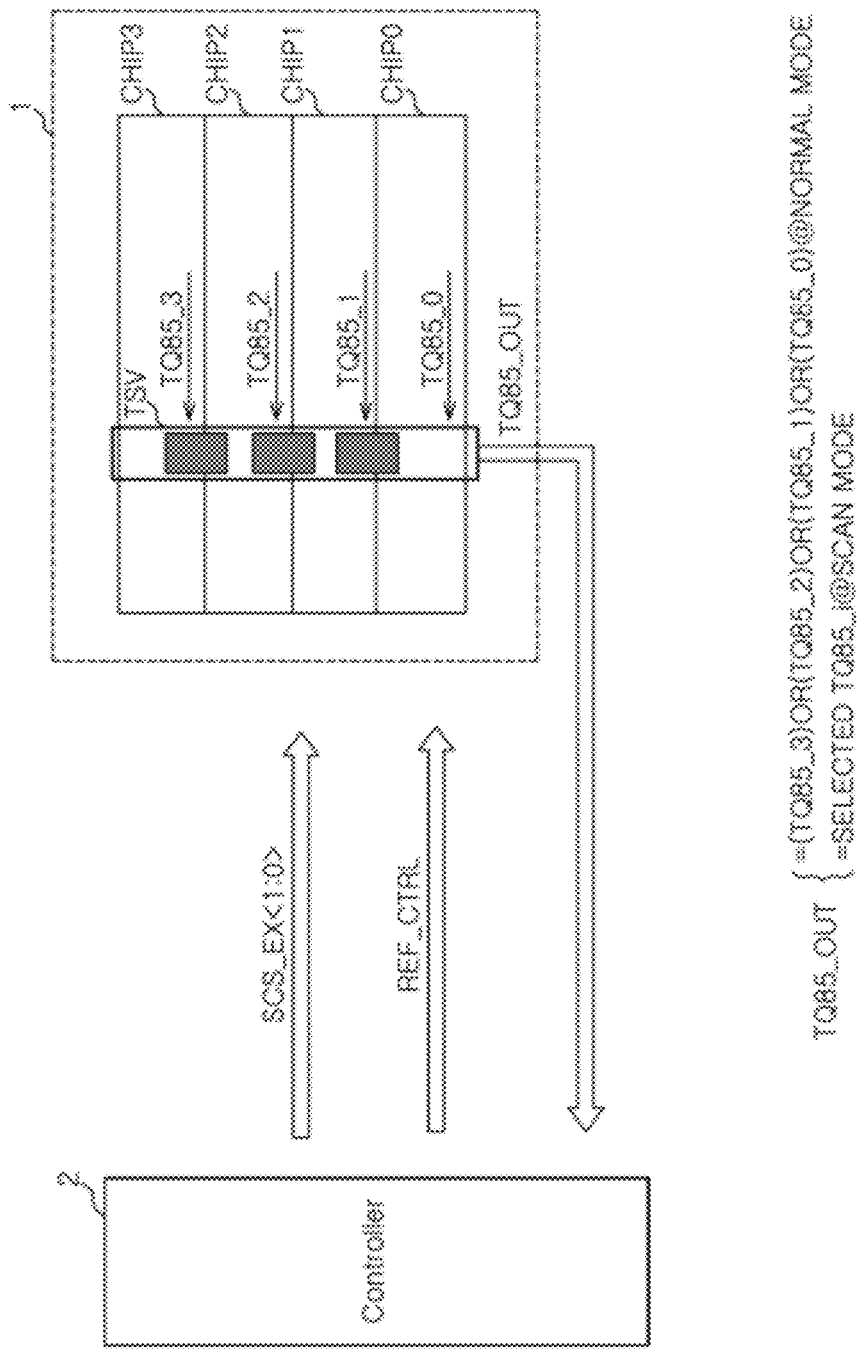
FIG. 1 is a conceptual diagram of a semiconductor system in accordance with an embodiment of the present invention.

Reference will now be made in detail to the exemplary embodiments consistent with the present disclosure, examples of which are illustrated in the accompanying drawings. Wherever possible, the same reference characters will be used throughout the drawings to refer to the same or like parts.

For reference, since terms, symbols and signs that are used in drawings and in this detailed description to designate devices, blocks, and so on may be used for detailed units as the occasion demands, it is to be noted that the same terms, symbols and signs may not designate the same devices, blocks, and so on in an entire circuitry. Also, the logic signals of a circuit and binary data values are divided into a high level (H) or a low level (L) in correspondence to voltage levels and may be represented as '1' and '0'. Furthermore, as the occasion demands, a high impedance state (a high-Z state) may be defined and described.

In order to achieve high degree of integration in a semiconductor memory apparatus and a semiconductor apparatus, various types of packages have been suggested. In particular, in a chip stack type in which a plurality of semiconductor chips are stacked to form one semiconductor apparatus, through-semiconductor chip lines may be used to commonly transfer signals across the plurality of semiconductor chips. Since semiconductor chips are usually manufactured from a single silicon wafer, the through-semiconductor chip lines are also called through-silicon vias (TSVs).

FIG. 1 is a conceptual diagram of a semiconductor system in accordance with an exemplary embodiment of the present invention.

The semiconductor system in accordance with the exemplary embodiment of the invention illustrates only a simplified configuration for the sake of clear description of the technical spirit to be suggested.

Referring to FIG. 1, a semiconductor system may include a semiconductor apparatus 1 and a controller 2.

The controller 2 may provide external chip selection code signals SCS_EX<1:0> to the semiconductor apparatus 1. Also, the controller 2 may control the refresh cycle of the semiconductor apparatus 1 based on a final combination signal TQ85_OUT as a temperature information signal which is outputted from the semiconductor apparatus 1. In a normal mode, the final combination signal TQ85_OUT is a signal which is generated by sequentially logically combining a plurality of internal information signals TQ85_0, TQ85_1, TQ85_2 and TQ85_3 from a plurality of semiconductor chips CHIP0, CHIP1, CHIP2 and CHIP3. If any one of the plurality of internal information signals TQ85_0, TQ85_1, TQ85_2 and TQ85_3 is activated, the final combination signal TQ85_OUT may be activated. Assuming that the internal information signals TQ85_0, TQ85_1, TQ85_2 and TQ85_3 are temperature information signals, the activation of the final combination signal TQ85_OUT means that the internal temperature of the semiconductor apparatus 1 has risen above a specified temperature. Assuming that the semiconductor apparatus 1 is a DRAM, a refresh cycle should be controlled in consideration of the temperature rise. Therefore, if the final combination signal TQ85_OUT is activated, the controller 2 may control the refresh cycle of the semiconductor apparatus 1 through a refresh control signal REF_CTRL, so that the refresh cycle of the semiconductor apparatus 1 is reduced.

The semiconductor apparatus 1 may include through-semiconductor chips lines (TSVs) which pass through the plurality of stacked semiconductor chips CHIP0, CHIP1, CHIP2 and CHIP3. The through-semiconductor chip lines (TSVs) may be formed in the respective semiconductor chips to transfer the signals processed by the internal circuits of the respective semiconductor chips to adjoining semiconductor chips.

In the normal mode, the uppermost semiconductor chip CHIP3, that is, the fourth semiconductor chip CHIP3, among the plurality of stacked semiconductor chips CHIP0, CHIP1, CHIP2 and CHIP3 may be configured to transfer its internal information signal TQ85_3 through a corresponding through-semiconductor chip line assigned to it, and the remaining semiconductor chips CHIP0 through CHIP2, that is, the first through third semiconductor chips CHIP0 through CHIP2 may be configured to logically combine the respective internal information signals transferred through their corresponding assigned through-semiconductor chip lines and their corresponding internal information signal TQ85_$i$, and sequentially transfer resultant signals through the through-semiconductor chip lines. That is to say, the first through third semiconductor chips CHIP0 through CHIP2 are configured to logically combine the internal information signals transferred from adjoining semiconductor chips and their internal information signals.

Namely, the third semiconductor chip CHIP2 may logically combine the internal information signal TQ85_3 of the fourth semiconductor chip CHIP3 transferred through the through-semiconductor chip line and its internal information signal TQ85_2, and transfer a resultant signal through the assigned corresponding through-semiconductor chip line.

Also, the second semiconductor chip CHIP1 may logically combine the internal information signal transferred through the through-semiconductor chip line, that is, the signal acquired by logically combining the internal information signals TQ85_3 and TQ85_2 of the fourth and third semiconductor chips CHIP3 and CHIP2 and its internal information signal TQ85_1, and transfer a resultant signal through the assigned corresponding through-semiconductor chip line.

Finally, the first semiconductor chip CHIP0 may logically combine the internal information signal transferred through the through-semiconductor chip line, that is, the signal acquired by logically combining sequentially the internal information signals TQ85_3, TQ85_2 and TQ85_1 of the fourth through second semiconductor chips CHIP3, CHIP2 and CHIP1 and its internal information signal TQ85_0, and transfer the thus generated final combination signal TQ85_OUT to the controller 2.

If any one of the plurality of internal information signals TQ85_0, TQ85_1, TQ85_2 and TQ85_3, which are respectively assigned to the plurality of semiconductor chips CHIP0, CHIP1, CHIP2 and CHIP3, is activated in the normal mode, the final combination signal TQ85_OUT, which is outputted through the through-semiconductor chip line (TSV), is outputted in an active state. Assuming that the internal information signals are temperature information signals, if the internal temperatures of the respective semiconductor chips have risen above a specified temperature, the respective semiconductor chips are activated and output their internal information signals TQ85_0, TQ85_1, TQ85_2 and TQ85_3. Accordingly, the activation of the final combination signal TQ85_OUT to a high level means that the temperature of at least any one of the plurality of semiconductor chips CHIP0, CHIP1, CHIP2 and CHIP3 has risen above the specified temperature.

In a scan mode, the semiconductor apparatus 1 transfers a corresponding internal information signal TQ85_i, which is outputted from a semiconductor chip selected among the plurality of semiconductor chips CHIP0, CHIP1, CHIP2 and CHIP3, sequentially through the plurality of through-semiconductor chip lines, and the corresponding internal information signal TQ85_i, which is externally outputted, is transferred to the controller 2. A plurality of chip selection code signals SCS_0<1:0>, SCS_1<1:0>, SCS_2<1:0> and SCS_3<1:0> for respectively controlling the plurality of semiconductor chips CHIP0, CHIP1, CHIP2 and CHIP3 may be defined as signals which are generated to have code values corresponding to the respective semiconductor chips by receiving the external chip selection code signals SCS_EX<1:0> provided from the external controller 2.

In other words, the scan mode may be defined as a test mode. In the test mode, the controller 2 may select any one of the plurality of semiconductor chips CHIP0, CHIP1, CHIP2 and CHIP3 and may be provided with the internal information signal of the selected semiconductor chip. For reference, in accordance with an exemplary embodiment, the plurality of chip selection code signals SCS_0<1:0>, SCS_1<1:0>, SCS_2<1:0> and SCS_3<1:0> for selecting the plurality of semiconductor chips CHIP0, CHIP1, CHIP2 and CHIP3 may be generated using signals which are set in the mode register sets of the respective semiconductor chips of the semiconductor apparatus 1.

Figure 2:
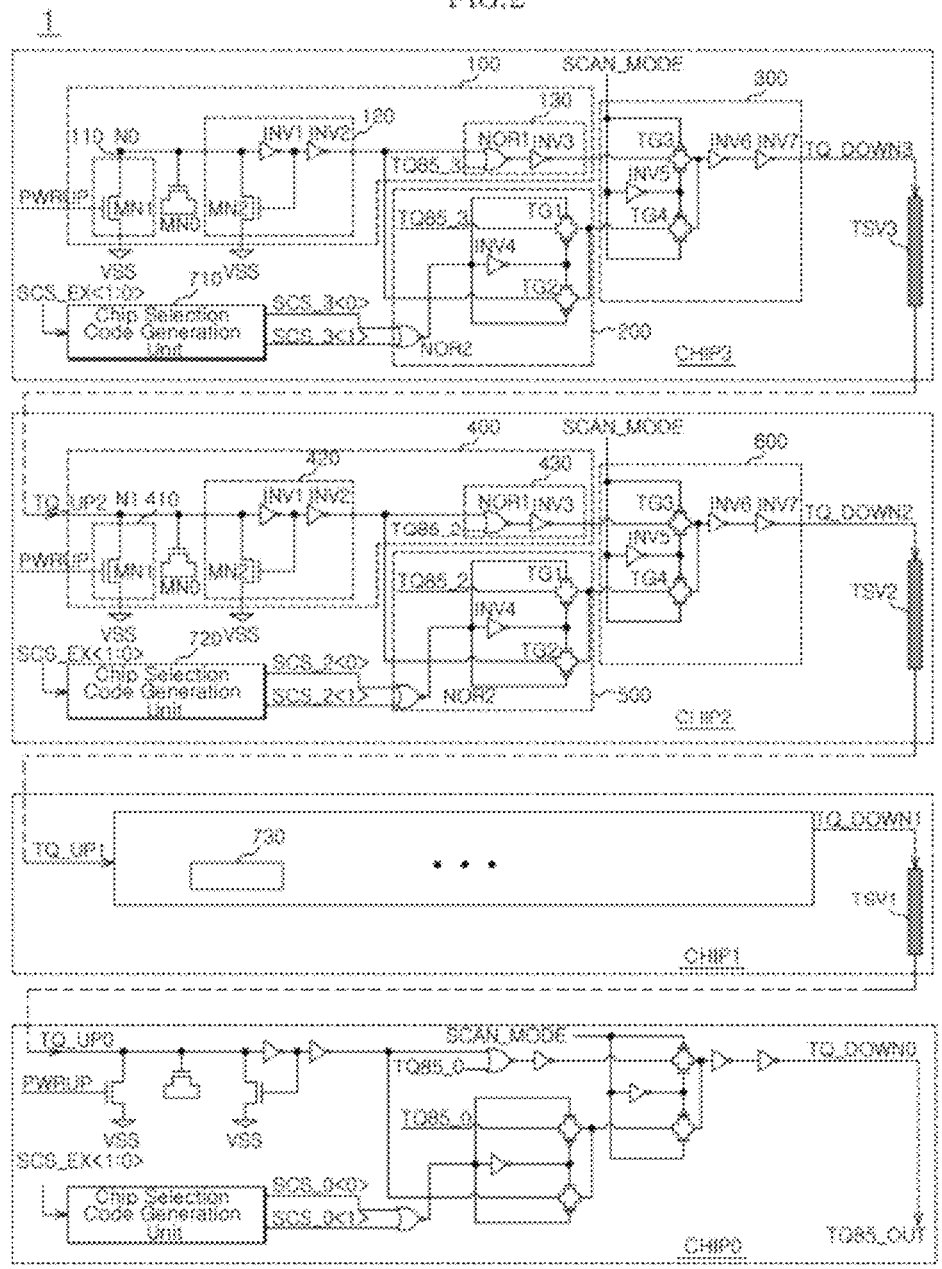
FIG. 2 is a circuit diagram illustrating a detailed embodiment of the semiconductor apparatus shown in FIG. 1.

FIG. 2 is a circuit diagram illustrating a detailed exemplary embodiment of the semiconductor apparatus shown in FIG. 1.

The semiconductor apparatus in accordance with the exemplary embodiment of the invention illustrates only a simplified configuration for the sake of clear description of the technical spirit to be suggested.

Referring to FIG. 2, a semiconductor apparatus 1 may comprise first through fourth semiconductor chips CHIP0, CHIP1, CHIP2, CHIP3 which are stacked upon one another.

The uppermost semiconductor chip, that is, the fourth semiconductor chip CHIP3 may include a normal operation processing unit 100, a scan operation processing unit 200, an output selection unit 300, and a chip selection code generation unit 710. The uppermost semiconductor chip in this configuration function as a master chip that controls the overall operations of all the semiconductor chips CHIP0, CHIP1, CHIP2 and CHIP3.

The chip selection code generation unit 710 may be configured to receive external chip selection code signals SCS_EX<1:0> and generate chip selection code signals SCS_3<1:0> assigned to it.

The normal operation processing unit 100 may be configured to output its internal information signal TQ85_3. In the present exemplary embodiment, the normal operation processing unit 100 may include an initialization section 110 configured to initialize an input node N0 in response to a power-up signal PWR_UP, a latch section 120 configured to latch the signal of the input node N0, and a logic section 130 configured to logically combine the signal outputted from the latch section 120 and its internal information signal TQ85_3. If the power-up signal PWP_UP is activated to a high level, since the input node N0 is initialized to a low level, the latch section 120 latches the signal of the input node N0 and provides the latched signal to the logic section 130. Because the logic section 130 logically combines its internal information signal TQ85_3 and the signal provided from the latch section 120 and outputs a resultant signal, the internal information signal TQ85_3 is outputted as an output signal.

The scan operation processing unit 200 is configured to selectively output its internal information signal TQ85_3 according to the code values of the chip selection code signals SCS_3<1:0> assigned to it. In the present exemplary embodiment, the scan operation processing unit 200 includes a logic section NOR2 and INV4 configured to logically combine the chip selection code signals SCS_3<1:0> assigned to it, and a plurality of switching sections TG1 and TG2 configured to selectively output their internal information signal TQ85_3 in response to the signal outputted from the logic section NOR2 and INV4. In a normal mode, since the code values of the chip selection code signals SCS_3<1:0> provided to the fourth semiconductor chip CHIP3 are "01", the signal outputted from the latch section 120 is outputted through the second switching section TG2. Meanwhile, in a scan mode, since the code values of the chip selection code signals SCS_3<1:0> provided to a selected semiconductor chip are "00", assuming that the fourth semiconductor chip CHIP3 is selected, the first switching section TG1 is turned on and outputs its internal information signal TQ85_3.

The output selection unit 300 is configured to output the signal outputted from the normal operation processing unit 100 to an assigned corresponding through-semiconductor chip line TSV3 in the normal mode and output the signal outputted from the scan operation processing unit 200 to the assigned corresponding through-semiconductor chip line TSV3 in the scan mode. In the present exemplary embodiment, the output selection unit 300 may include a plurality of switching sections TG3 and TG4 configured to selectively is transfer the signal outputted from the normal operation processing unit 100 or the signal outputted from the scan operation processing unit 200 to the assigned corresponding through-semiconductor chip line TSV3 in response to a scan mode signal SCAN_MODE. The scan mode signal SCAN_MODE is a signal which is deactivated to a low level in the normal mode and is activated to a high level in the scan mode. Since the third switching section TG3 is turned on in the normal mode, the output signal of the normal operation processing unit 100 is transferred to the assigned corresponding through-semiconductor chip line TSV3, and since the fourth switching section TG4 is turned on in the scan mode, the output signal of the scan operation processing unit 200 is transferred to the assigned corresponding through-semiconductor chip line TSV3.

The first through third semiconductor chips CHIP0 through CHIP2 may comprise the same types of circuits.

Accordingly, the detailed configuration and the principal operations of the third semiconductor chip CHIP2 will be representatively explained below in detail.

The third semiconductor chip CHIP2 may include a normal operation processing unit 400, a scan operation processing unit 500, an output selection unit 600, and a chip selection code generation unit 720.

The chip selection code generation unit 720 may be configured to receive the external chip selection code signals SCS_EX<1:0> and generate chip selection code signals SCS_2<1:0> is assigned to it.

The normal operation processing unit 400 may be configured to output its internal information signal TQ85_2 upon power-up, and logically combine the internal information signal TQ85_3 transferred from the adjoining fourth semiconductor chip CHIP3 and its internal information signal TQ85_2 and output a resultant signal, after power-up. In the present exemplary embodiment, the normal operation processing unit 400 may include an initialization section 410 configured to initialize an input node N1 which receives the signal transferred from the fourth semiconductor chip CHIP3, in response to the power-up signal PWR_UP, a latch section 420 configured to latch the signal of the input node N1, and a logic section 430 configured to logically combine the signal outputted from the latch section 420 and its internal information signal TQ85_2. If the power-up signal PWP_UP is activated to a high level, since the input node N1 is initialized to a low level, the latch section 420 latches the signal of the input node N1 and provides the latched signal to the logic section 430. Because the logic section 430 logically combines its internal information signal TQ85_2 and the signal provided from the latch section 420 and outputs a resultant signal, the internal information signal TQ85_2 is outputted as an output signal. If a power-up operation is completed and the power-up signal PWR_UP has a low level, the internal information signal TQ85_3 of the fourth semiconductor chip CHIP3 is transferred to the input node N1. Accordingly, the logic section 430 logically combines its internal information signal TQ85_2 and the internal information signal TQ85_3 of the fourth semiconductor chip CHIP3 and outputs a resultant signal.

The scan operation processing unit 500 is configured to selectively output its internal information signal TQ85_2 or the internal information signal TQ85_3 transferred from the fourth semiconductor chip CHIP3 according to the code values of the chip selection code signals SCS_2<1:0> assigned to it. In the present exemplary embodiment, the scan operation processing unit 500 may include a logic section NOR2 and INV4 configured to logically combine the code values of the chip selection code signals SCS_2<1:0> assigned to it, and a plurality of switching sections TG1 and TG2 configured to selectively output their internal information signal TQ85_2 or the internal information signal TQ85_3 of the fourth semiconductor chip CHIP3 inputted through the input node N1, in response to the signal outputted from the logic section NOR2 and INV4.

In the normal mode, since the code values of the chip selection code signals SCS_2<1:0> provided to the third semiconductor chip CHIP2 is "10", the signal outputted from the latch section 420 is outputted through the second switching section TG2. Meanwhile, in the scan mode, since the code values of the chip selection code signals SCS_2<1:0> provided to a selected semiconductor chip is "00", assuming that the third semiconductor chip CHIP2 is selected, the first switching section TG1 is turned on and outputs its internal information signal TQ85_2.

The output selection unit 600 is configured to output the signal outputted from the normal operation processing unit 400 to an assigned corresponding through-semiconductor chip line TSV2 in the normal mode and output the signal outputted from the scan operation processing unit 500 to the assigned corresponding through-semiconductor chip line TSV2 in the scan mode. In the present exemplary embodiment, the output selection unit 600 may include a plurality of switching sections TG3 and TG4 configured to selectively transfer the signal outputted from the normal operation processing unit 400 or the signal outputted from the scan operation processing unit 500 to the assigned corresponding through-semiconductor chip line TSV2 in response to the scan mode signal SCAN_MODE. The scan mode signal SCAN_MODE is deactivated to a low level in the normal mode and is activated to a high level in the scan mode. Accordingly, since the third switching section TG3 is turned on in the normal mode, the output signal of the normal operation processing unit 400 is transferred to the assigned corresponding through-semiconductor chip line TSV2, and since the fourth switching section TG4 is turned on in the scan mode, the output signal of the scan operation processing unit 500 is transferred to the assigned corresponding through-semiconductor chip line TSV2.

For reference, while both the fourth semiconductor chip CHIP3 and the first through third semiconductor chips CHIP0 through CHIP2 are explained in the present exemplary embodiment so far, it is to be noted that this is to explain the semiconductor chips CHIP0 through CHIP3 in terms of functional operation and the first through fourth semiconductor chips CHIP0, CHIP1, CHIP2 and CHIP3 actually comprises the same circuits. Also, while the semiconductor apparatus composed of the four stacked semiconductor chips is exemplified in the present exemplary embodiment, this is nothing but an exemplary illustration, and it is conceivable that the present invention can be applied to a semiconductor apparatus composed of at least two stacked semiconductor chips.

TABLE 1

| CHIP | SCS i<1> | SCS i<0> |
| --- | --- | --- |
| CHIP3 | 0 | 1 |
| CHIP2 | 1 | 0 |
| CHIP1 | 1 | 1 |
| CHIP0 | 0 | 0 |

Table 1 shows the code values of the chip selection code signals SCS_i<1:0> which are assigned to each of the first through fourth semiconductor chips CHIP0, CHIP1, CHIP2 and CHIP3. That is to say, the chip selection code generation units 710, 720, 730 and 740, which are provided to the respective semiconductor chips, receive the external chip selection code signals SCS_EX<1:0> and generate the plurality of chip selection code signals SCS_3<1:0>, SCS_2<1:0>, SCS_1<1:0> and SCS_0<1:0>, respectively, which have preset code values. The code values are code values which are assigned to distinguish the respective semiconductor chips, and the code values of "00" are transferred to a selected semiconductor chip in the scan mode. For reference, the code values assigned to each semiconductor chip may be controlled in the normal mode.

Therefore, the final combination signal TQ85_OUT outputted in the normal mode is a signal which is generated by logically combining sequentially the internal information signals of the respective semiconductor chips, and the final combination signal TQ85_OUT outputted in the scan mode is an internal information signal TQ85_i of a semiconductor chip selected by the chip selection code signal SCS_i<1:0>. The code values of the chip selection code signals SCS_i<1:0> provided to the selected semiconductor chip in the scan mode are set to "00".

As described above, the semiconductor apparatus in accordance with the exemplary embodiment of the present invention can sequentially combine a plurality of internal information signals and transfer resultant signals to through-semiconductor chip lines, and, in a scan mode, can output the internal information signal of a semiconductor chip selected among a plurality of semiconductor chips.

For reference, in the present exemplary embodiment, each of the plurality of semiconductor chips of the semiconductor apparatus includes all of a normal operation processing unit, a scan operation processing unit and an output selection unit so as to operate differently according to a normal mode or the scan mode. However, it is conceivable in another exemplary embodiment that each semiconductor chip includes only a normal operation processing is unit so that respective internal information signals are sequentially combined and a final combination signal is outputted.

In another exemplary embodiment of the present invention, a method for outputting internal information of a plurality of stacked semiconductor chips includes the steps of applying external chip selection code signals to the plurality of stacked semiconductor chips and generating chip selection code signals assigned to the respective semiconductor chips, and sequentially transferring internal information signals assigned to the respective semiconductor chips through a plurality of through-semiconductor chip lines in response to the chip selection code signals, wherein each of the plurality of semiconductor chips logically combines an internal information signal transferred through a through-semiconductor chip line from an adjoining semiconductor chip and its internal information signal and outputs a resultant signal.

So far, exemplary embodiments of the present invention have been described in detail. For reference, embodiments including additional component elements, which are not directly associated with the technical spirit of the present invention, may be exemplified in order to describe the present invention in further detail. Moreover, an active high configuration or an active low configuration for indicating the activated states of signals and circuits may vary depending upon an embodiment. Furthermore, the configurations of transistors may be changed as the occasion demands in order to realize the same function. That is to say, the configurations of a PMOS transistor and an NMOS transistor may be replaced with each other, and as the occasion demands, various transistors may be employed. In addition, the configurations of logic gates may be changed as the occasion demands in order to realize the same function. That is to say, a NANDing element, a NORing element and the like may be configured through various combinations of a NAND gate, a NOR gate, an inverter, and the like. Since these embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, the semiconductor apparatus, the semiconductor system, and the method for outputting internal information thereof described herein should not be limited based on the described embodiments. Rather, the semiconductor apparatus, the semiconductor system, and the method for outputting internal information thereof described herein should only be limited in light of the claims that follow when taken in conjunction with the above description and accompanying drawings.

What is claimed is:

1. A semiconductor apparatus including a plurality of through-semiconductor chip lines which pass through a plurality of stacked semiconductor chips,
    wherein, in a normal mode, an uppermost semiconductor chip among the plurality of stacked semiconductor chips is configured to transfer its internal information signal to an adjoining semiconductor chip through an assigned corresponding through-semiconductor chip line, and at least one semiconductor chip other than the uppermost semiconductor chip is configured to logically combine respective internal information signals transferred through through-semiconductor chip lines and their internal information signals and sequentially transfer resultant signals to assigned corresponding through-semiconductor chip lines, the at least one semiconductor chip other than the uppermost semiconductor chip logically combining the internal information signals transferred through the through-semiconductor chip lines from adjoining semiconductor chips and its internal information signals, and
    wherein, in a scan mode, a corresponding internal information signal outputted from a semiconductor chip selected among the plurality of semiconductor chips is sequentially transferred through the plurality of through-semiconductor chip lines, and the internal information signal of the selected semiconductor chip is not combined with the internal information signals of the non-selected semiconductor chips.

2. The semiconductor apparatus according to claim 1, wherein, in the normal mode, if any one of a plurality of internal information signals respectively assigned to the plurality of semiconductor chips is activated, a final combination signal is activated.

3. The semiconductor apparatus according to claim 2, wherein the final combination signal is configured to be outputted to an outside.

4. The semiconductor apparatus according to claim 1, wherein chip selection code signals for selecting the plurality of semiconductor chips are provided from an outside.

5. The semiconductor apparatus according to claim 1, wherein the chip selection code signals for selecting the plurality of semiconductor chips are signals which are generated using mode register set codes.

6. The semiconductor apparatus according to claim 1, wherein the internal information signals are temperature information signals.

7. The semiconductor apparatus according to claim 1, wherein the scan mode is a kind of test mode.

8. The semiconductor apparatus according to claim 1, wherein the uppermost semiconductor chip among the plurality of semiconductor chips comprises:
    a chip selection code generation unit configured to receive external chip selection code signals and generate chip selection code signals assigned to it;
    a normal operation processing unit configured to output its internal information signal;
    a scan operation processing unit configured to selectively output its internal information signal according to code values of chip selection code signals assigned to it and
    an output selection unit configured to output a signal outputted from the normal operation processing unit to an assigned corresponding through-semiconductor chip line in the normal mode, and output a signal outputted from the scan operation processing unit to an assigned corresponding through-semiconductor chip line in the scan mode.

9. The semiconductor apparatus according to claim 8, wherein the normal operation processing unit comprises:
   an initialization section configured to initialize an input node in response to a power-up signal;
   a latch section configured to latch a signal of the input node; and
   a logic section configured to logically combine a signal outputted from the latch section and its internal information signal.

10. The semiconductor apparatus according to claim 8, wherein the scan operation processing unit comprises:
    a logic section configured to logically combine chip selection code signals assigned to it; and
    a plurality of switching sections configured to selectively output their internal information signals in response to a signal outputted from the logic section.

11. The semiconductor apparatus according to claim 8, wherein the output selection unit comprises:
    a plurality of switching sections configured to selectively output the signal outputted from the normal operation processing unit or the signal outputted from the scan operation processing unit to the assigned corresponding through-semiconductor chip line in response to a scan mode signal.

12. The semiconductor apparatus according to claim 1, wherein the at least one semiconductor chip other than the uppermost semiconductor chip comprises:
    a chip selection code generation unit configured to receive external chip selection code signals and generate chip selection code signals assigned to it;
    a normal operation processing unit configured to output its internal information signal upon power-up, and logically combine an internal information signal transferred from an adjoining semiconductor chip and its internal information signal and output a resultant signal, after power-up;
    a scan operation processing unit configured to selectively output its internal information signal or the internal information signal transferred from the adjoining semiconductor chip according to code values of chip selection code signals assigned to it; and
    an output selection unit configured to output a signal outputted from the normal operation processing unit to an assigned corresponding through-semiconductor chip line in the normal mode and output a signal outputted from the scan operation processing unit to the assigned corresponding through-semiconductor chip line in the scan mode.

13. The semiconductor apparatus according to claim 12, wherein the normal operation processing unit comprises:
    an initialization section configured to initialize an input node which receives an internal information signal transferred from an adjoining semiconductor chip through a through-semiconductor chip line, in response to a power-up signal;
    a latch section configured to latch a signal of the input node; and
    a logic section configured to logically combine a signal outputted from the latch section and its internal information signal.

14. The semiconductor apparatus according to claim 12, wherein the scan operation processing unit comprises:
    a logic section configured to logically combine chip selection code signals signed to it; and
    a plurality of switching sections configured to selectively output their internal information signals or an internal information signal transferred from an adjoining semiconductor chip in response to a signal outputted from the logic section.

15. The semiconductor apparatus according to claim 12, wherein the output selection unit comprises:
    a plurality of switching sections configured to selectively output the signal outputted from the normal operation processing unit or the signal outputted from the scan operation processing unit to the assigned corresponding through-semiconductor chip line in response to a scan mode signal.

16. A semiconductor apparatus including a plurality of through-semiconductor chip lines which pass through a plurality of stacked semiconductor chips, wherein an uppermost semiconductor chip among the plurality of stacked semiconductor chips is configured to transfer its internal information signal to an assigned corresponding through-semiconductor chip line, and remaining semiconductor chips are configured to logically combine respective internal information signals transferred through through-semiconductor chip lines and their internal information signals and sequentially transfer resultant signals to assigned corresponding through-semiconductor chip lines, the respective remaining semiconductor chips logically combining the internal information signals transferred through the through-semiconductor chip lines from adjoining semiconductor chips and their internal information signals,
    wherein the uppermost semiconductor chip comprises an initialization section configured to initialize an input node in response to a power-up signal;
    a latch section configured to latch a signal of the input node; and
    a logic section configured to logically combine a signal outputted from the latch section and its internal information signal, and output a logical combination result to an assigned corresponding through-semiconductor chip line.

17. The semiconductor apparatus according to claim 16, wherein, if any one of a plurality of internal information signals respectively assigned to the plurality of semiconductor chips is activated, a final combination signal is activated.

18. The semiconductor apparatus according to claim 17, wherein the final combination signal is configured to be outputted to an outside.

19. The semiconductor apparatus according to claim 16, wherein the internal information signals are temperature information signals.

* * * * *